United States Patent
Zhang et al.

(10) Patent No.: US 11,024,508 B2
(45) Date of Patent: Jun. 1, 2021

(54) INDEPENDENT CONTROL OF ETCHING AND PASSIVATION GAS COMPONENTS FOR HIGHLY SELECTIVE SILICON OXIDE/SILICON NITRIDE ETCHING

(71) Applicant: Tokyo Electron Limited, Tokyo (JP)

(72) Inventors: Du Zhang, Albany, NY (US); Yu-Hao Tsai, Albany, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/828,308

(22) Filed: Mar. 24, 2020

(65) Prior Publication Data
US 2020/0321218 A1    Oct. 8, 2020

Related U.S. Application Data

(60) Provisional application No. 62/830,223, filed on Apr. 5, 2019.

(51) Int. Cl.
*H01L 21/3065* (2006.01)
(52) U.S. Cl.
CPC .............. *H01L 21/30655* (2013.01)
(58) Field of Classification Search
None
See application file for complete search history.

(56) References Cited

U.S. PATENT DOCUMENTS

| | | | |
|---|---|---|---|
| 4,324,611 A | 4/1982 | Vogel et al. | |
| 5,286,344 A | 2/1994 | Blalock et al. | |
| 5,505,816 A * | 4/1996 | Barnes ............... | H01L 21/31116 438/695 |
| 6,387,819 B1 * | 5/2002 | Yu ..................... | H01L 21/31138 216/41 |

(Continued)

FOREIGN PATENT DOCUMENTS

| KR | 1020160126890 A | 11/2016 |
|---|---|---|
| WO | 2019027811 A1 | 2/2019 |

OTHER PUBLICATIONS

Korean Intellectual Property Office, International Search Report and Written Opinion for International application No. PCT/US2020/024446, dated Jul. 17, 2020, 9pp.

(Continued)

*Primary Examiner* — Shamim Ahmed

(57) ABSTRACT

A method for selective plasma etching of silicon oxide relative to silicon nitride is described. The method includes providing a substrate containing a silicon oxide film and a silicon nitride film, and selectively etching the silicon oxide film relative to the silicon nitride film by: a1) exposing the substrate to a plasma-excited passivation gas containing carbon, sulfur, or both carbon and sulfur, where the plasma-excited passivation gas does not contain fluorine or hydrogen, and b1) exposing the substrate to a plasma-excited etching gas containing a fluorine-containing gas. The method can further include, between a1) and b1), an additional step of a2) exposing the substrate to a plasma-excited (Continued)

additional passivation gas containing a fluorocarbon gas, hydrofluorocarbon gas, a hydrochlorocarbon gas, a hydrochlorofluorocarbon gas, or a hydrocarbon gas, or a combination thereof.

19 Claims, 7 Drawing Sheets

(56) References Cited

U.S. PATENT DOCUMENTS

| | | | |
|---|---|---|---|
| 6,803,318 B1* | 10/2004 | Qiao | H01L 21/31116 257/E21.252 |
| 9,412,605 B2* | 8/2016 | Kelly | H01L 21/324 |
| 9,716,012 B2* | 7/2017 | Thompson | C23C 16/45551 |
| 10,446,407 B2* | 10/2019 | Sherpa | H01J 37/3244 |
| 2001/0034135 A1* | 10/2001 | Miyakawa | H01L 21/31116 438/710 |
| 2014/0308817 A1 | 10/2014 | Matsuoka et al. | |
| 2016/0064247 A1 | 3/2016 | Tomura et al. | |
| 2016/0196985 A1* | 7/2016 | Tan | H01L 21/32139 438/694 |
| 2016/0247691 A1 | 8/2016 | Watanabe et al. | |
| 2016/0314985 A1 | 10/2016 | Yang et al. | |
| 2018/0108537 A1* | 4/2018 | Takahashi | C09K 13/00 |

OTHER PUBLICATIONS

Norstrom, H. et al. "RIE of SiO2 in doped and undoped fluorocarbon plasmas" Vacuum, vol. 32, No. 12. (1982), pp. 737-745.

Lindstrom, J.L. et al. "Reactive Ion Etching of Silicon Nitride Deposited by Different Methods in CH4/H2 Plasmas" J. Electrochem. Soc., vol. 139, No. 1, Jan. 1992, pp. 317-319.

Zhang, Y. et al. "Fluorocarbon high density plasmas. VII. Investigation of selective SiO2-to-Si3N4 high density plasma etch processes" J. Vac. Sci. Technol. A 14(4), Jul./Aug. 1996, pp. 2127-2137.

Gaboriau, F. et al. "Selective and deep plasma etching of SiO2: Comparison between different fluorocarbon gases (CF4, C2F6, CHF3) mixed with CH4 or H2 and influence of the residence time" J. Vac. Sci. Technol. B 20(4), Jul./Aug. 2002, pp. 1514-1521.

Sherpa, D. S. and Ranjan, A. "Quasi-atomic layer etching of silicon nitride" J. Vac. Sci. Technol. A 35(1), Jan./Feb. 2017, pp. 01A102-1-01A102-6.

Bouchilaoun, M. et al. "A Hydrogen Plasma Treatment for Soft and Selective Silicon Nitride Etching" Phys. Status Solidi A 2018, 215, 1700658, 5 pages.

* cited by examiner

INDEPENDENT CONTROL OF ETCHING AND PASSIVATION GAS COMPONENTS FOR HIGHLY SELECTIVE SILICON OXIDE/SILICON NITRIDE ETCHING

CROSS-REFERENCE TO RELATED APPLICATIONS

This application is related to and claims priority to U.S. Provisional Patent Application Ser. No. 62/830,223 filed on Apr. 5, 2019, the entire contents of which are herein incorporated by reference.

FIELD OF INVENTION

The present invention relates to the field of semiconductor manufacturing and semiconductor devices, and more particularly, to a method of selective plasma etching of silicon oxide relative to silicon nitride in semiconductor manufacturing.

BACKGROUND OF THE INVENTION

Next generation semiconductor technology development poses a huge challenge as dry etch removal of one material selective to other materials is needed. Selective silicon oxide etching relative to silicon nitride has many applications and preferential passivation (mostly carbon-based) has been extensively explored for high etch selectivity when using plasmas containing fluorocarbon (FC) or hydrofluorocarbon (HFC) gases. However, many conventional etching methods have limitations that include lack of separate control of the etching component fluorine or hydrogen) versus the passivation component (e.g., carbon) in the plasma-excited processing gas. For example, an etching gas containing $C_4F_6$/$C_4F_8$ gases contributes to passivation and a passivation gas containing $H_2$/$CH_2F_2$/$CH_3F$/$CH_4$ gases also contributes to etching. Further, many etching methods use only one FC or HFC gas, which provides inadequate flexibility for selectively etching silicon oxide relative to silicon nitride for advanced semiconductor devices. Attempts to fully separate the etching component and the passivation component have not provided full independent control.

SUMMARY OF THE INVENTION

A method of selective plasma etching of silicon oxide relative to silicon nitride in semiconductor manufacturing is disclosed in several embodiments.

According to one embodiment, the plasma processing method includes providing a substrate containing a silicon oxide film and a silicon nitride film, and selectively etching the silicon oxide film relative to the silicon nitride film by: a1) exposing the substrate to a plasma-excited passivation gas containing carbon, sulfur, or both carbon and sulfur, where the passivation gas does not contain fluorine or hydrogen, and b1) exposing the substrate to a plasma-excited etching gas containing a fluorine-containing gas.

According to one embodiment, the plasma processing method includes providing a substrate containing a silicon oxide film and a silicon nitride film, and selectively etching the silicon oxide film relative to the silicon nitride film by: a1) exposing the substrate to a plasma-excited passivation gas, wherein the plasma-excited passivation gas includes CO, COS, $CS_2$, $CCl_4$, $C_2Cl_4$, $CCl_2Br_2$, $SCl_2$, $S_2Cl_2$, or a combination thereof, and where the passivation gas does not contain fluorine or hydrogen, and b1) exposing the substrate to a plasma-excited etching gas containing $F_2$, $XeF_2$, $ClF_3$, HF, or $NF_3$, or a combination thereof.

According to one embodiment, the plasma processing method includes providing a substrate containing a silicon oxide film and a silicon nitride film, and selectively etching the silicon oxide film relative to the silicon nitride film by: a1) exposing the substrate to a plasma-excited passivation gas, where the plasma excited passivation gas includes CO, COS, $CS_2$, $CCl_4$, $C_2Cl_4$, $CCl_2Br_2$, $SCl_2$, or $S_2Cl_2$, or a combination thereof, and wherein the passivation gas does not contain fluorine or hydrogen, a2) exposing the substrate to a plasma-excited additional passivation gas containing a fluorocarbon gas, a hydrofluorocarbon gas, a hydrochlorocarbon gas, a hydrochlorofluorocarbon gas, a hydrocarbon gas, or a combination thereof, and b1) exposing the substrate to a plasma-excited etching gas containing $F_2$, $XeF_2$, $ClF_3$, HF, $NF_3$, or a combination thereof.

DETAILED DESCRIPTION OF SEVERAL EMBODIMENTS

A method of selective plasma etching of silicon oxide relative to silicon nitride is described. The method utilizes independent control of etching and passivation gas components for highly selective silicon oxide/silicon nitride etching.

The inventive selective plasma etching of silicon oxide relative to silicon nitride described in embodiments of the invention fundamentally differs from conventional silicon oxide or silicon nitride etching process by plasmas containing a fluorocarbon (FC) gas or a hydrofluorocarbon (HFC) gas. In the inventive process, the passivation gas does not contain fluorine or hydrogen species that contribute to etching, but the passivation gas includes a passivation component (carbon, sulfur, or both carbon and sulfur) that shows sufficient volatility difference on silicon oxide versus silicon nitride. The higher volatility of the passivation component on silicon oxide surfaces is thought to be due to the "closed-shell" nature (no unpaired electrons) of carbon by-products on the silicon oxide surfaces, compared to "open-shell" nature (unpaired electrons) of carbon by-products on the silicon nitride surfaces. Further, sulfur-containing etch by-products are thought to be volatile on silicon oxide surfaces but involatile as polymers on silicon nitride surfaces.

The etching component is provided using a fluorine-containing gas. According to an embodiment, the fluorine-containing gas does not contain a fluorocarbon gas or a hydrofluorocarbon gas. This full separation of the passivation component and the etching component greatly enhances the processing window and the etch selectivity between silicon oxide and silicon nitride.

Figure 1:
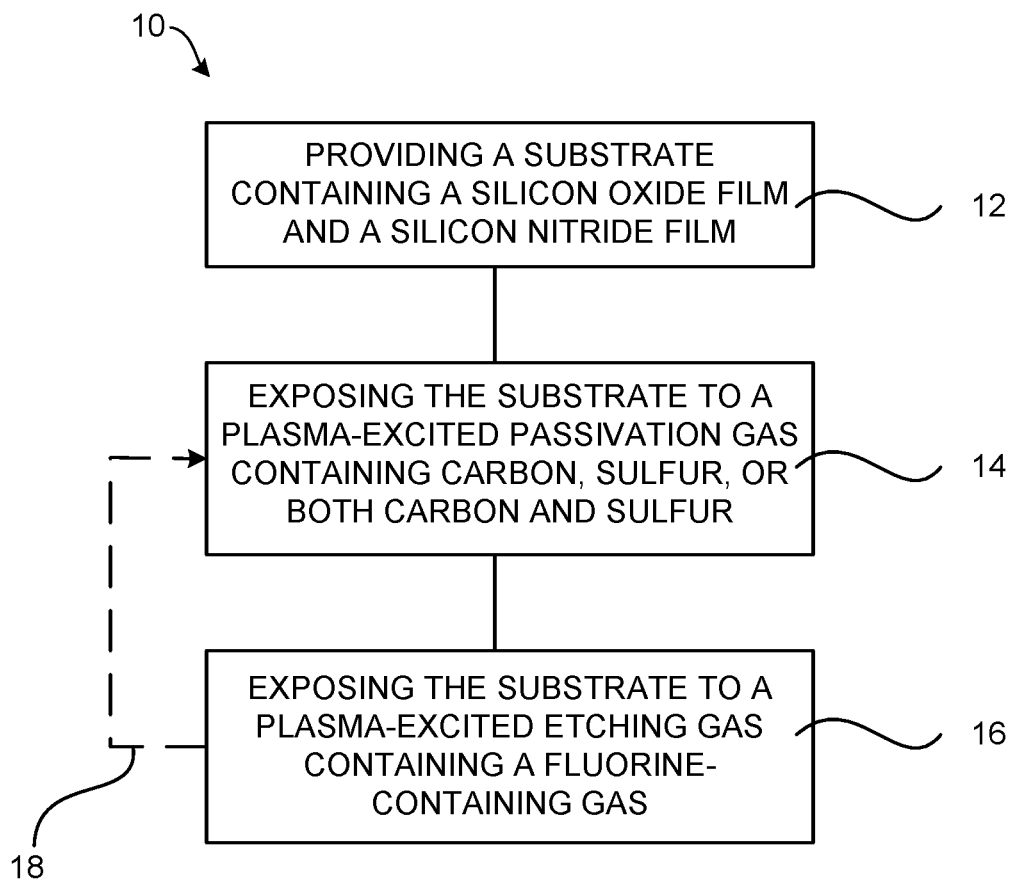
FIG. 1 is a process flow diagram for selective plasma etching of a silicon oxide film relative to a silicon nitride film according to an embodiment of the invention.

FIG. 1 is a process flow diagram for selective plasma etching of a silicon oxide film relative to a silicon nitride film according to an embodiment of the invention, and FIGS. 2A-2F schematically show through cross-sectional views a method of selective plasma etching of a silicon oxide film relative to a silicon nitride film according to an embodiment of the invention.

Figure 2A:
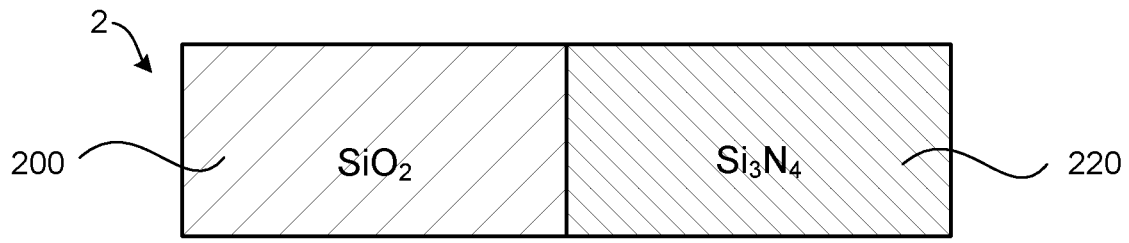
FIGS. 2A-2F schematically show through cross-sectional views a method of selective plasma etching of a silicon oxide film relative to a silicon nitride film according to an embodiment of the invention.

Referring now to FIG. 1 and FIG. 2A, the plasma processing method 10 includes, in 12, providing a substrate 2 containing a silicon oxide film 200 (e.g., $SiO_2$) and a silicon nitride film 220 (e.g., $Si_3N_4$). In the example shown in FIG. 2A, the silicon oxide film 200 and the silicon nitride film 220 are in the same horizontal plane, but embodiments of the invention may also be applied to films that are not in the same horizontal plane but are offset vertically. $Si_3N_4$ is the most thermodynamically stable of the silicon nitrides and hence the most commercially important of the silicon nitrides. However, embodiments of the invention may be applied to other silicon nitrides that contain Si and N as the major constituents, where the silicon nitrides can have a wide range of Si and N compositions. Similarly, $SiO_2$ is the most thermodynamically stable of the silicon oxides and hence the most commercially important of the silicon oxides. However, embodiments of the invention may be applied to other silicon oxides that contain Si and O as the major constituents, where the silicon oxides can have a wide range of Si and O compositions.

Figure 2B:
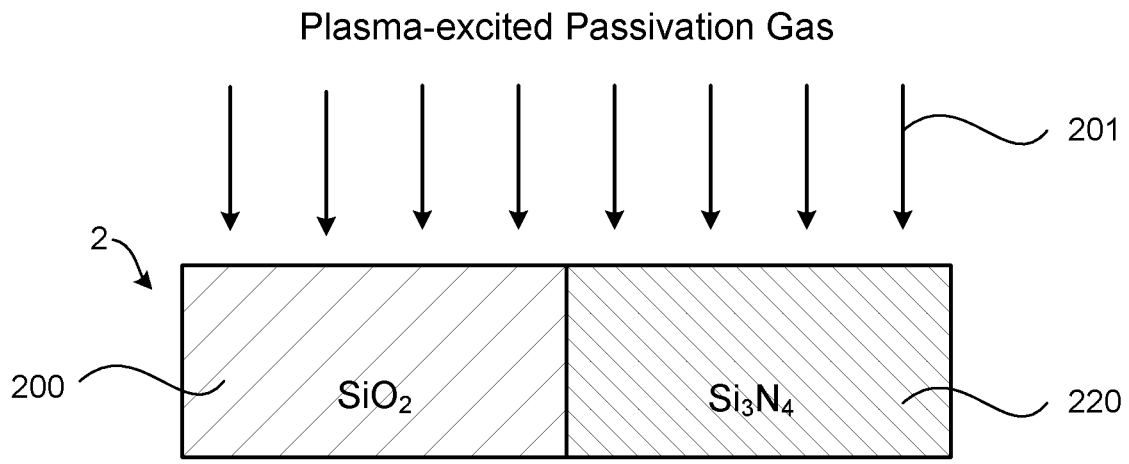
Figure 2C:
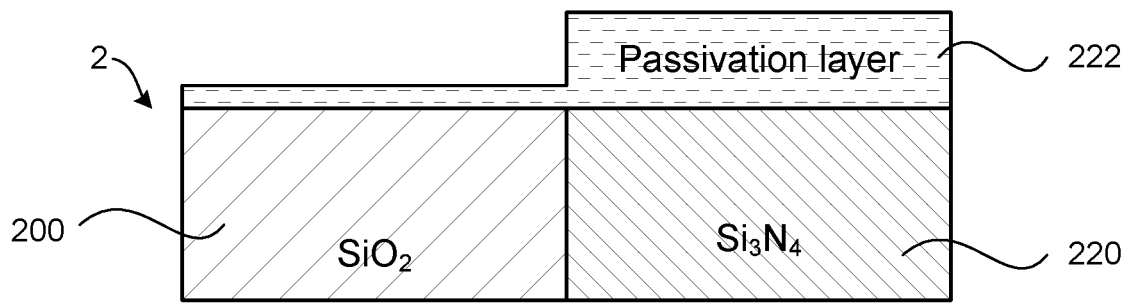

The method further includes, in 14, exposing the substrate 2 to a plasma-excited passivation gas 201 containing carbon, sulfur, or both carbon and sulfur, where the plasma-excited passivation gas 201 does not contain fluorine or hydrogen. This is schematically shown in FIG. 2B. In one example, the plasma-excited passivation gas 201 gas can include CO, COS, $CS_2$, $CCl_4$, $C_2Cl_4$, $CCl_2Br_2$, $SCl_2$, or $S_2Cl_2$, or a combination thereof. The exposure to the plasma-excited passivation gas 201 forms a passivation layer 222 on the substrate 2 as shown in FIG. 2C. The passivation layer 222 is thicker on the silicon nitride film 220 than on the silicon oxide film 200 due to the higher volatility of the by-products of the plasma-excited passivation gas 201 on the silicon oxide film 200 than on the silicon nitride film 220.

Figure 2D:
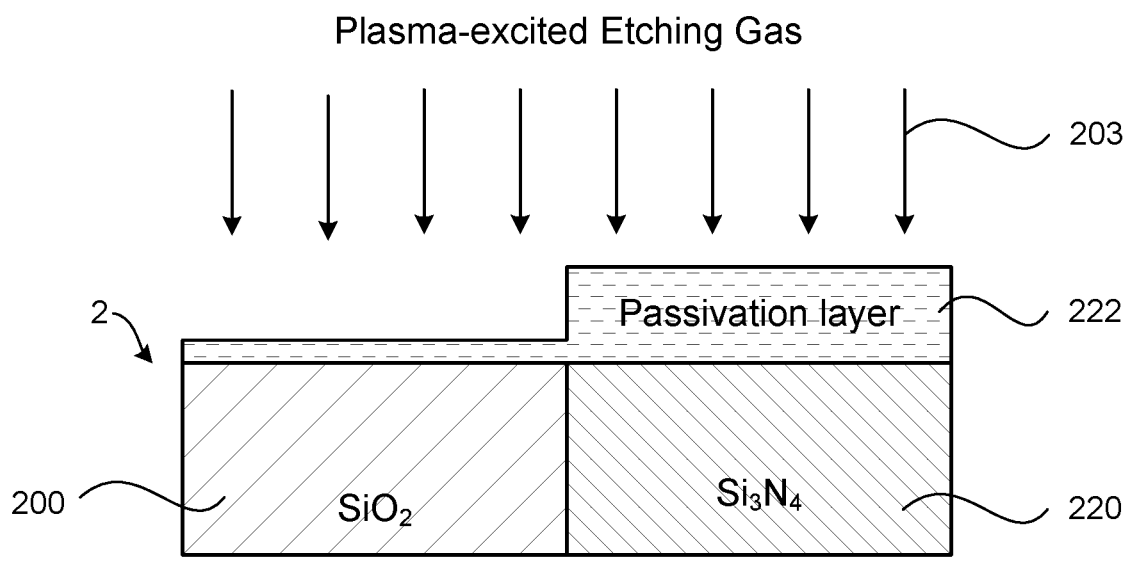
Figure 2E:
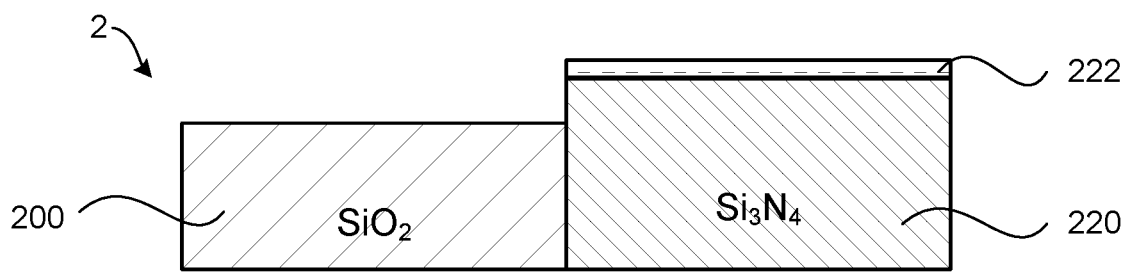

The method further includes, in 16, exposing the substrate to a plasma-excited etching gas 203 containing a fluorine-containing gas. This is schematically shown in FIG. 2D. In one example, plasma-excited etching gas 203 includes $F_2$, $XeF_2$, $ClF_3$, HF, $NF_3$, or a combination thereof. The plasma-excited etching gas can optionally further include Ar, He, or a combination thereof. According to an embodiment, the fluorine-containing gas does not contain a fluorocarbon gas or a hydrofluorocarbon gas. The exposure to the plasma-excited etching gas 203 selectively etches the silicon oxide film 200 relative to the silicon nitride film 220 due to the thicker passivation layer 222 on the silicon nitride film 220 than on the silicon oxide film 200. The selective etching is schematically shown in FIG. 2E, where the passivation layer 222 is removed from the silicon oxide film 200 and the silicon oxide film 200 is etched, while the passivation layer 222 on the silicon nitride film 220 is thinned but protects the silicon nitride film 220 from etching.

According to one embodiment, the exposing steps 14 and 16 may be performed alternatively and sequentially. Further, as shown by the process arrow 18, the exposing steps 14 and 16 may be repeated at least once to further selectively etch the silicon oxide film 200. According to one embodiment, the exposing steps 14 and 16 may at least partially overlap in time.

Figure 2F:
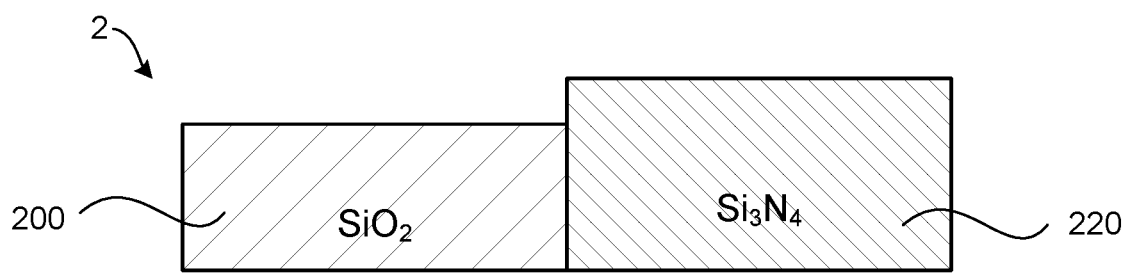

The method can further include removing the passivation layer 222 from the substrate 2 using an ashing process following the etching process. This is schematically shown in FIG. 2F.

Figure 3:
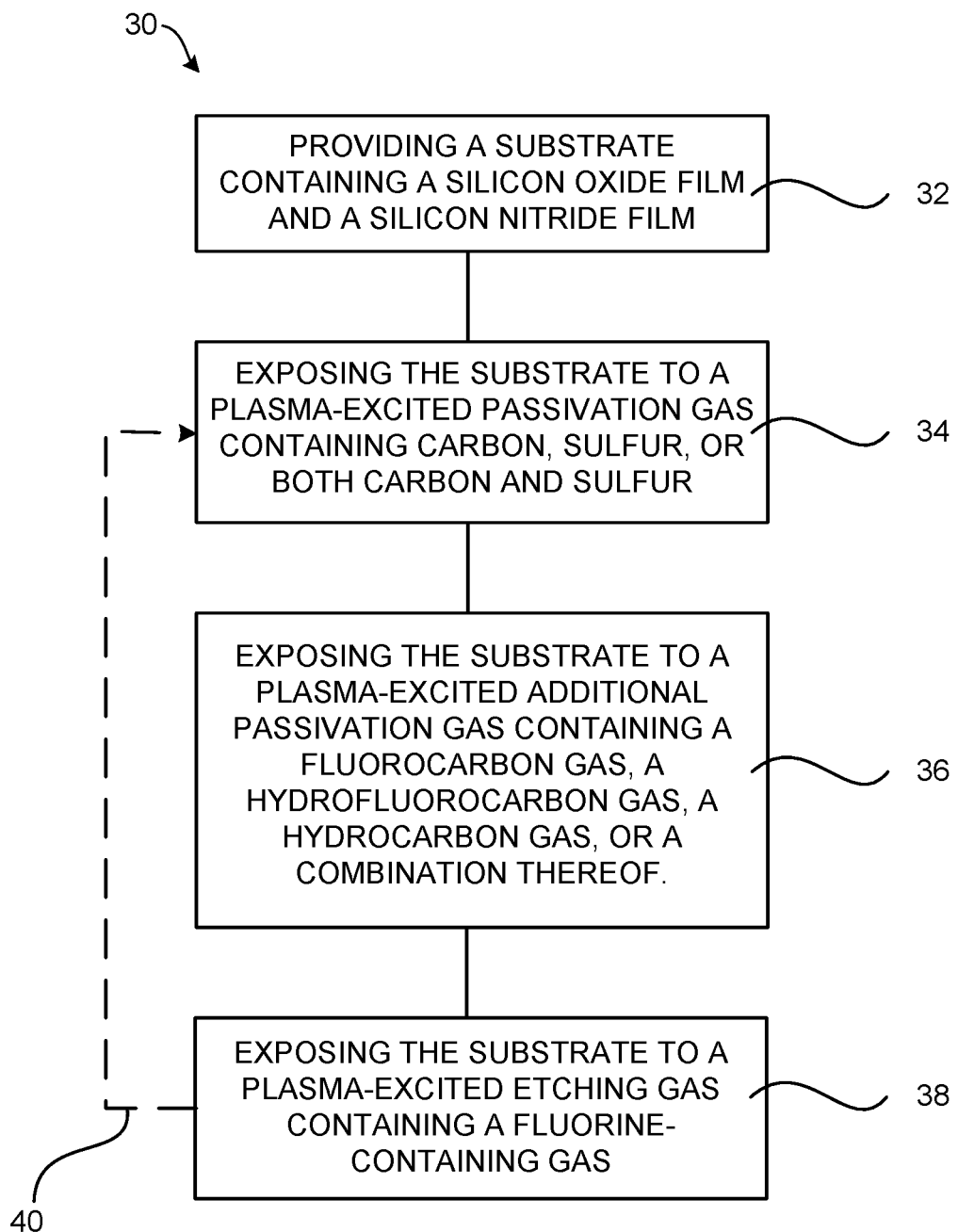
FIG. 3 is a process flow diagram for selective plasma etching of a silicon oxide film relative to a silicon nitride film according to another embodiment of the invention.

FIG. 3 is a process flow diagram for selective plasma etching of a silicon oxide film relative to a silicon nitride film according to an embodiment of the invention, and FIGS. 4A-4H schematically show through cross-sectional views a method of selective plasma etching of a silicon oxide film relative to a silicon nitride film according to another embodiment of the invention.

Figure 4A:
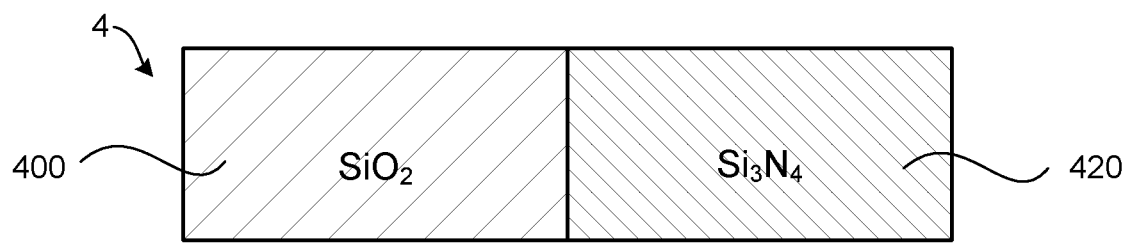
FIGS. 4A-4H schematically show through cross-sectional views a method of selective plasma etching of a silicon oxide film relative to a silicon nitride film according to another embodiment of the invention.

Referring now to FIG. 3 and FIG. 4A, the plasma processing method 30 includes, in 32, providing a substrate 4 containing a silicon oxide film 400 and a silicon nitride film 420. In the example shown in FIG. 4A, the silicon oxide film 400 and the $Si_3N_4$ film 420 are in the same horizontal plane, but embodiments of the invention may also be applied to films that are not in the same horizontal plane but are offset vertically.

Figure 4B:
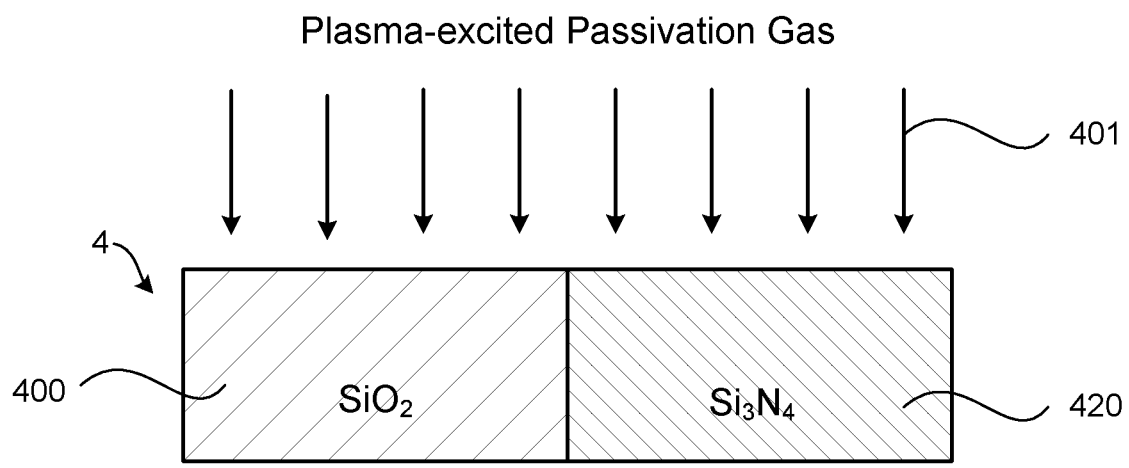
Figure 4C:
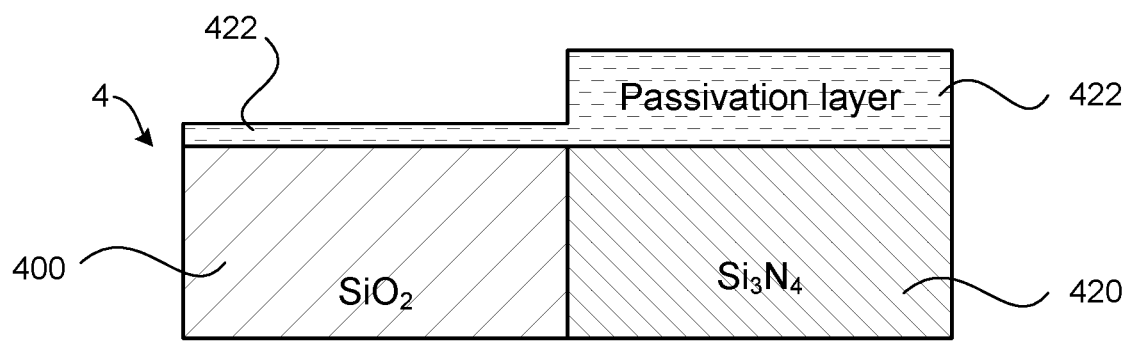
Figure 4D:
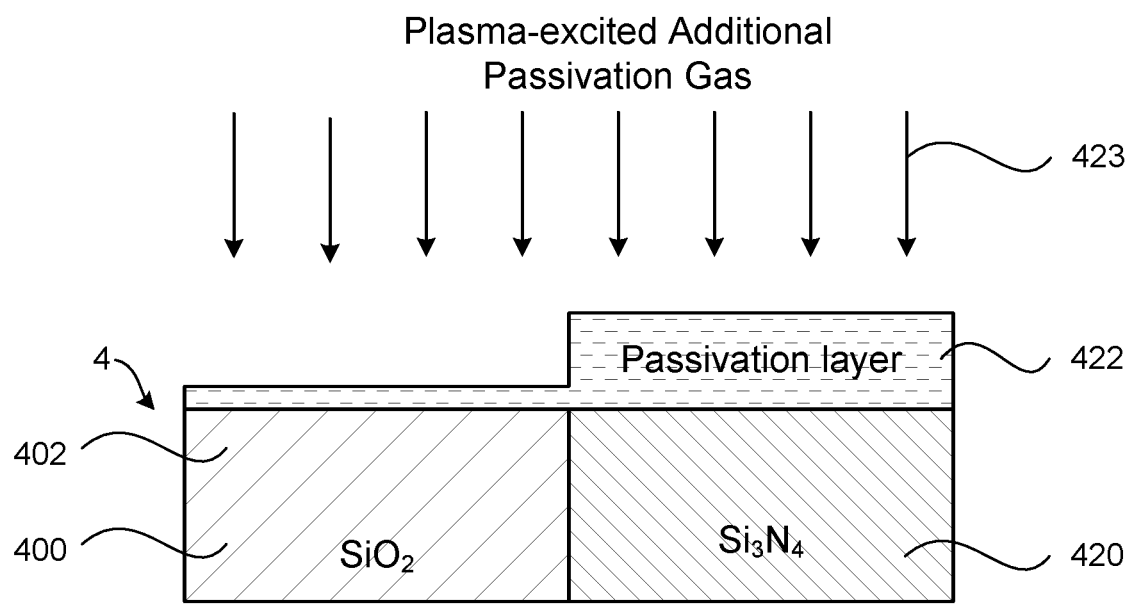

The method further includes, in 34, exposing the substrate 4 to a plasma-excited passivation gas 401 containing carbon, sulfur, or both carbon and sulfur, where the passivation gas does not contain fluorine or hydrogen. This is schematically shown in FIG. 4B. In one example, the plasma-excited passivation gas 401 can include CO, COS, $CS_2$, $CCl_4$, $C_2Cl_4$, $CCl_2Br_2$, $SCl_2$, $S_2Cl_2$, or a combination thereof. The exposure to the plasma-excited passivation gas 401 forms a passivation layer 422 on the substrate 4 as shown in FIG. 4C. The passivation layer 422 is thicker on the silicon nitride film 420 than on the silicon oxide film 400 due to the higher volatility of the by-products of the plasma-excited passivation gas 401 on the silicon oxide film 400 than on the silicon nitride film 420.

Figure 4E:
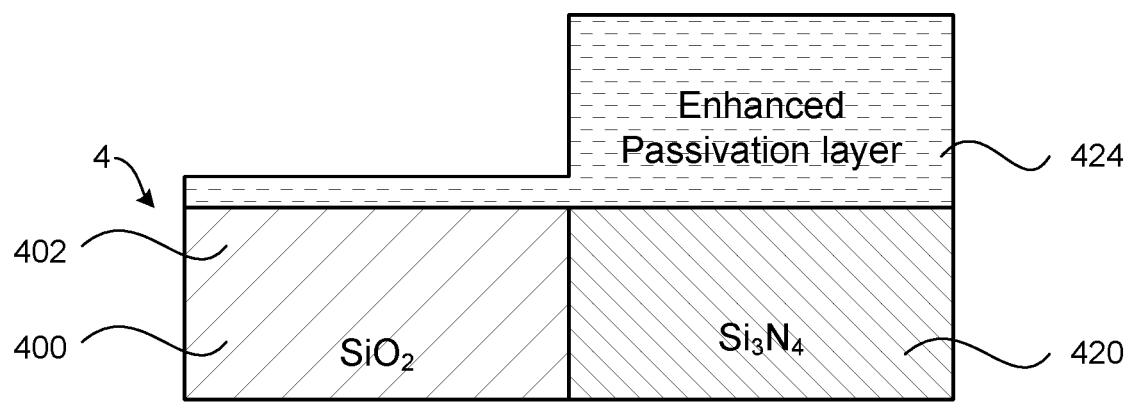

The method further includes, in 36, exposing the substrate 4 to a plasma-excited additional passivation gas 423 containing a fluorocarbon gas, a hydrofluorocarbon gas, a hydrochlorocarbon gas, a hydrochlorofluorocarbon gas, a hydrocarbon gas, or a combination thereof. In one example, the plasma-excited additional passivation gas can contain $CF_2Cl_2$, $CH_2F_2$, $CH_4$, $CH_3F$, $CHF_3$, $C_4H_6$, $C_2H_4$, $C_3H_6$, $CH_2Cl_2$, $CH_3Cl$, $CH_3Cl$, $CH_2ClF$, $CHCl_2F$, or a combination thereof. The exposure to the plasma-excited additional passivation gas 423 forms an enhanced passivation layer 424 on the substrate 4 as shown in FIG. 4E. The exposure to the plasma-excited additional passivation gas 423 is used for modifying and strengthening the passivation layer 422 without damaging the underlying silicon nitride film 420, since the passivation layer 422 protects the underlying silicon nitride film 420 during the plasma exposure. In one example, the exposure to the plasma-excited additional passivation gas 423 may be performed using low or zero substrate bias to avoid damaging of the silicon nitride film 420 by fluorine or hydrogen ions and/or radicals in the plasma.

Figure 4F:
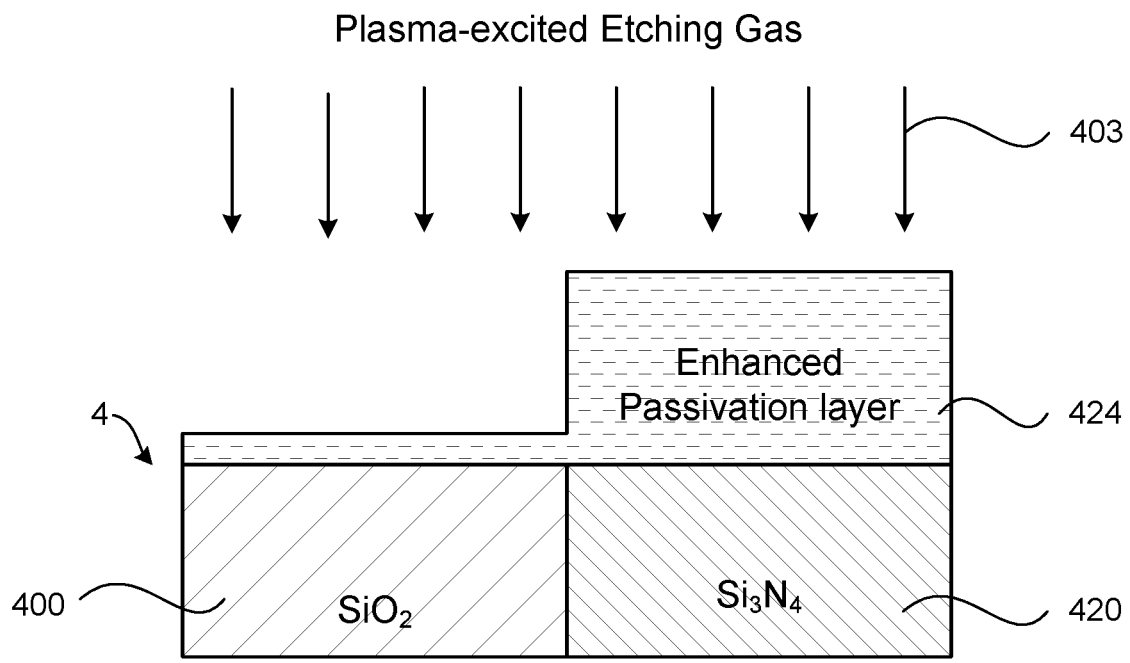
Figure 4G:
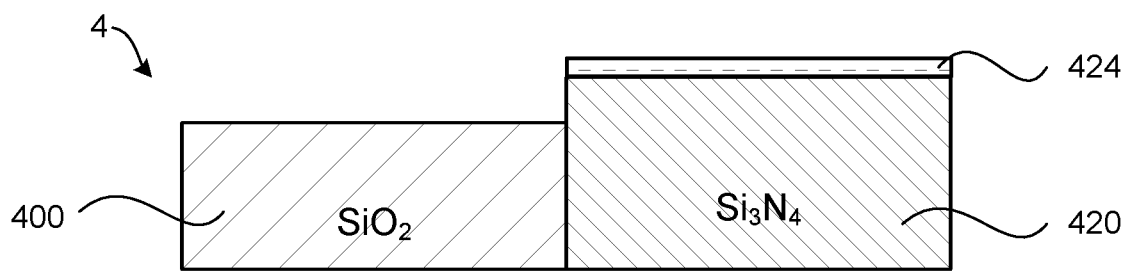

The method further includes, in 38, exposing the substrate 4 to a plasma-excited etching gas 403 containing a fluorine-containing gas. This is schematically shown in FIG. 4F. In one example, plasma-excited etching gas 403 includes $F_2$, $XeF_2$, $ClF_3$, HF, $NF_3$, or a combination thereof. The plasma-excited etching gas can optionally further include Ar, He, or a combination thereof. According to an embodiment, the fluorine-containing gas does not contain a fluorocarbon gas or a hydrofluorocarbon gas. The exposure to the plasma-excited etching gas 403 selectively etches the silicon oxide film 400 relative to the silicon nitride film 420 as shown in FIG. 4G.

The exposure to the plasma-excited etching gas 403 selectively etches the silicon oxide film 400 relative to the silicon nitride film 420 due to the thicker enhanced passivation layer 424 on the silicon nitride film 420 than on the silicon oxide film 400. The selective etching is schematically shown in FIG. 4G, where the enhanced passivation layer 424 is removed from the silicon oxide film 400 and the silicon oxide film 400 is etched, while the enhanced passivation layer 424 on the silicon nitride film 420 is thinned but protects the silicon nitride film 420 from etching.

According to one embodiment, the exposing steps 34-38 may performed alternatively and sequentially. In one example, the exposing steps 34-38 may performed alternatively and sequentially in the order: 34, followed by 36, and followed by 38. Further, as shown by the process arrow 40, the exposing steps 34-38 may be repeated at least once to further selectively etch the silicon oxide film 400. According to one embodiment, one or more of the exposing steps 34-38 may at least partially overlap in time.

Figure 4H:
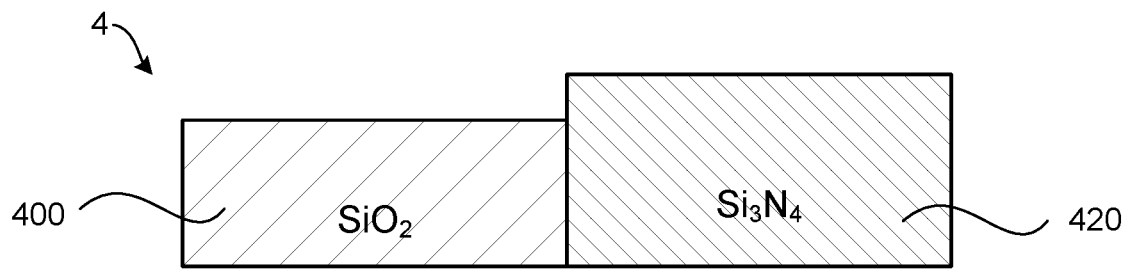

The method can further include removing the enhanced passivation layer 424 from the substrate 4 using an ashing process following the etching process. This is schematically shown in FIG. 4H.

The method of selective plasma etching of silicon oxide films relative to silicon nitride films may be performed in conventional commercial plasma processing systems, including Inductively Coupled Plasma (ICP) systems, Capacitively Coupled Plasma (CCP) systems, microwave plasma systems, remote plasma systems that generate plasma excited species upstream from the substrate, electron cyclotron resonance (ECR) systems, and other systems.

The selective silicon oxide/silicon nitride etching process may be performed at substrate temperatures, gas flows, gas flow ratios, and gas pressures that optimize etch selectivity between silicon oxide and silicon nitride. Examples include a substrate temperature between about −200° C. and about 200° C., between about −100° C. and about 25° C., between about 0° C. and about 100° C., between about 0° C. and about 200° C., between about −30° C. and about 25° C., or between about 0° C. and about 25° C. The gas pressure in the plasma etch chamber can between about 5 mTorr and about 1000 mTorr, between about 10 mTorr and 500 mTorr, or between about 20 mTorr and about 100 mTorr. Examples of gas flows are from 0.1 sccm to 500 sccm, with flow ratio of any gas from 0% to 100%.

A plurality of embodiments for a method of selective plasma etching of silicon oxide relative to silicon nitride in semiconductor manufacturing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A plasma processing method, comprising:
   providing a substrate containing a silicon oxide film and a silicon nitride film; and
   selectively etching the silicon oxide film relative to the silicon nitride film by:
   a1) exposing the substrate to a plasma-excited passivation gas containing carbon, sulfur, or both carbon and sulfur, wherein the passivation gas does not contain fluorine or hydrogen, and
   b1) exposing the substrate to a plasma-excited etching gas containing a fluorine-containing gas.

2. The method of claim 1, wherein step a1) forms a passivation layer that is thicker on the silicon nitride film than on the silicon oxide film.

3. The method of claim 1, wherein the exposing steps a1) and b1) are performed alternatively and sequentially.

4. The method of claim 3, further comprising
   repeating the exposing steps a1) and b1) at least once to further selectively etch the silicon oxide film.

5. The method of claim 1, wherein the plasma-excited etching gas includes $F_2$, $XeF_2$, $ClF_3$, HF, $NF_3$, or a combination thereof.

6. The method of claim 1, wherein the plasma-excited etching gas does not contain a fluorocarbon gas or a hydrofluorocarbon gas.

7. The method of claim 1, wherein the plasma excited passivation gas includes CO, COS, $CS_2$, $CCl_4$, $C_2Cl_4$, $CCl_2Br_2$, $SCl_2$, $S_2Cl_2$, or a combination thereof.

8. The method of claim 1, wherein the silicon oxide film includes $SiO_2$ and the silicon nitride film includes $Si_3N_4$.

9. The method of claim 1, further comprising:
   a2) exposing the substrate to a plasma-excited additional passivation gas containing a fluorocarbon gas, a hydrofluorocarbon gas, a hydrochlorocarbon gas, a hydrochlorofluorocarbon gas, a hydrocarbon gas, or a combination thereof.

10. The method of claim 9, wherein the plasma-excited additional passivation gas contains $CF_2Cl_2$, $CH_2F_2$, $CH_4$, $CH_3F$, $CHF_3$, $C_4H_6$, $C_2H_4$, $C_3H_6$, $CH_2Cl_2$, $CH_3Cl$, $CH_3Cl$, $CH_2ClF$, $CHCl_2F$, or a combination thereof.

11. The method of claim 9, wherein the exposing steps a1), a2), and b1) are performed alternatively and sequentially in the order a1), followed by a2), and followed by b1).

12. The method of claim 9, further comprising:
   alternatively and sequentially repeating the exposing steps a1), a2), and b1) at least once to further selectively etch the silicon oxide film.

13. The method of claim 9, wherein the exposing steps a1) and a2) at least partially overlap in time.

14. A plasma processing method, comprising:
   providing a substrate containing a silicon oxide film and a silicon nitride film; and
   selectively etching the silicon oxide film relative to the silicon nitride film by:
   a1) exposing the substrate to a plasma-excited passivation gas, wherein the plasma excited passivation gas includes CO, COS, $CS_2$, $CCl_4$, $C_2Cl_4$, $CCl_2Br_2$, $SCl_2$, $S_2Cl_2$, or a combination thereof, and wherein the passivation gas does not contain fluorine or hydrogen, and thereafter
   b1) exposing the substrate to a plasma-excited etching gas containing $F_2$, $XeF_2$, $ClF_3$, HF, $NF_3$, or a combination thereof.

15. The method of claim 14, wherein the plasma-excited etching gas does not contain a fluorocarbon gas or a hydrofluorocarbon gas.

16. A plasma processing method, comprising:
providing a substrate containing a silicon oxide film and a silicon nitride film; and
selectively etching the silicon oxide film relative to the silicon nitride film by:
  a1) exposing the substrate to a plasma-excited passivation gas, wherein the plasma excited passivation gas includes CO, COS, $CS_2$, $CCl_4$, $C_2Cl_4$, $CCl_2Br_2$, $SCl_2$, or $S_2Cl_2$, or a combination thereof, and wherein the passivation gas does not contain fluorine or hydrogen,
  a2) exposing the substrate to a plasma-excited additional passivation gas containing a fluorocarbon gas, a hydrofluorocarbon gas, a hydrochlorocarbon gas, a hydrochlorofluorocarbon gas, a hydrocarbon gas, or a combination thereof, and thereafter
  b1) exposing the substrate to a plasma-excited etching gas containing $F_2$, $XeF_2$, $ClF_3$, HF, $NF_3$, or a combination thereof.

17. The method of claim 16, wherein the plasma-excited additional passivation gas contains $CF_2Cl_2$, $CH_2F_2$, $CH_4$, $CH_3F$, $CHF_3$, $C_4H_6$, $C_2H_4$, $C_3H_6$, $CH_2Cl_2$, $CH_3Cl$, $CH_3Cl$, $CH_2ClF$, $CHCl_2F$, or a combination thereof.

18. The method of claim 16, wherein the plasma-excited etching gas does not contain a fluorocarbon gas or a hydrofluorocarbon gas.

19. The method of claim 16, wherein the exposing steps a1), a2), and b1) are performed alternatively and sequentially in the order a1), followed by a2), and followed by b1).

* * * * *